(12) United States Patent
Van Eickels et al.

(10) Patent No.: US 10,421,225 B2
(45) Date of Patent: Sep. 24, 2019

(54) METHOD FOR MANUFACTURING AN ARRANGEMENT COMPRISING A HOUSING PART AND AT LEAST TWO CONDUCTOR PATHS

(71) Applicant: Mahle International GmbH, Stuttgart (DE)

(72) Inventors: Bernd Van Eickels, Esslingen (DE); Peer Niekamp, Leutenbach (DE)

(73) Assignee: Mahle International GmbH, Stuttgart (DE)

( * ) Notice: Subject to any disclaimer, the term of this patent is extended or adjusted under 35 U.S.C. 154(b) by 0 days.

(21) Appl. No.: 15/524,620

(22) PCT Filed: Oct. 28, 2015

(86) PCT No.: PCT/EP2015/075013
§ 371 (c)(1),
(2) Date: May 4, 2017

(87) PCT Pub. No.: WO2016/071181
PCT Pub. Date: May 12, 2016

(65) Prior Publication Data
US 2017/0312957 A1    Nov. 2, 2017

(30) Foreign Application Priority Data

Nov. 5, 2014  (DE) .......... 10 2014 222 597

(51) Int. Cl.
*H01R 43/00*  (2006.01)
*B29C 45/14*  (2006.01)
(Continued)

(52) U.S. Cl.
CPC ........ *B29C 45/14639* (2013.01); *B23K 31/02* (2013.01); *B29C 45/14467* (2013.01);
(Continued)

(58) Field of Classification Search
CPC ........ B29C 45/14639; B29C 45/14467; B29C 45/14549; H01B 13/0036; B23K 31/02
See application file for complete search history.

(56) References Cited

U.S. PATENT DOCUMENTS 5,067,905 A * 11/1991 Matsumoto .......... H01R 9/2458
439/76.2
5,446,626 A    8/1995 Dittmann et al.
(Continued)

FOREIGN PATENT DOCUMENTS

DE    4323827 C1    12/1994
DE    19713008 C1    6/1998
(Continued)

OTHER PUBLICATIONS

German Search Report for DE-102014222597.3, dated Oct. 27, 2015.

*Primary Examiner* — Paul D Kim
(74) *Attorney, Agent, or Firm* — Fishman Stewart PLLC

(57) ABSTRACT

A method of manufacturing an assembly with a housing part and at least two conductors of shape sheet metal parts may include providing at least one first conductor formed from at least one sheet metal part and at least one second conductor formed from at least one sheet metal part. The method may then include arranging the first and second conductors in an injection mold in such a way that the first conductor may come into mechanical contact with the second conductor in a common contact zone to produce an electrical connection. The method may then include at least partially overmolding the first and second conductors with a plastic to form a joint housing part. The method may further include bonding the first and second conductors in a region of the common contact zone after at least partially overmolding the first and second conductors.

14 Claims, 3 Drawing Sheets

(51) Int. Cl.
    *H05K 3/00*           (2006.01)
    *H05K 3/20*           (2006.01)
    *B23K 31/02*          (2006.01)
    *H01B 13/00*          (2006.01)
    *B29L 31/34*          (2006.01)

(52) U.S. Cl.
    CPC ... *B29C 45/14549* (2013.01); *H01B 13/0036* (2013.01); *H05K 3/0014* (2013.01); *H05K 3/202* (2013.01); *B29C 45/14221* (2013.01); *B29L 2031/3481* (2013.01); *H05K 2201/0999* (2013.01); *H05K 2201/09118* (2013.01); *H05K 2201/10272* (2013.01)

(56) References Cited

U.S. PATENT DOCUMENTS

| | | | | |
|---|---|---|---|---|
| 5,847,937 | A * | 12/1998 | Cepa | B23K 31/02 361/809 |
| 6,094,811 | A | 8/2000 | Neumann-Henneberg | |
| 6,655,968 | B2 | 12/2003 | Kasai | |
| 7,002,813 | B2 * | 2/2006 | Bergmann | H01L 31/02013 29/739 |
| 8,779,321 | B2 * | 7/2014 | Fujimoto | B23K 9/167 219/75 |
| 2002/0028590 | A1 | 3/2002 | Saito et al. | |
| 2008/0102716 | A1 | 5/2008 | Nishioka et al. | |

FOREIGN PATENT DOCUMENTS

| | | |
|---|---|---|
| DE | 60125294 T2 | 7/2007 |
| EP | 2525634 A1 | 11/2012 |

\* cited by examiner

METHOD FOR MANUFACTURING AN ARRANGEMENT COMPRISING A HOUSING PART AND AT LEAST TWO CONDUCTOR PATHS

CROSS-REFERENCE TO RELATED APPLICATIONS

This application claims priority to German Patent Application No. DE 10 2014 222 597.3, filed on Nov. 5, 2014, and International Patent Application No. PCT/EP2015/075013, filed on Oct. 28, 2015, the contents of both of which are incorporated by reference in their entirety.

TECHNICAL FIELD

The invention relates to a method of producing an assembly with a housing part and at least two conductors made of shaped sheet metal parts.

BACKGROUND

For controlling electric/electronic components of a motor vehicle as well as for providing these components with electrical energy a number of electrical leads is usually required. From the prior art it is known to produce such leads in the form of sheet metal parts, which form electrical conductors. The sheet metal parts forming the conductors can together with other electrical/electronic components be overmoulded using suitable injection moulding tools with a plastic housing. When using suitable injection moulding tools for forming electrical connections the sheet metal parts or conductors can also be passed outwards through the housing.

Such assemblies with conductors and with a plastic housing which is injection moulded around the conductors are used in motor vehicles, for example in the electrical wiring of electrial actuators for wastegate valves etc.

A disadvantage of such assemblies known from the prior art is that for different electrical applications an individual set of conductors and/or sheet metal parts has to be designed and manufactured in each case, even though the conductors actually required for the various applications only differ from one another slightly. This applies, for example, when actuators of technically similar designs of wastegate valves have to be electrically wired with the help of said conductors.

Against this background EP 2 525 634 A1 describes a method of manufacturing an electrical coil of a transformer. For this, a substrate with several conductors is covered with a plastic, wherein a fastening section remains free of plastic. At the fastening section an electronic component can be applied at a later point and electrically connected with the conductors. However, this only takes place after the conductors have already been embedded in the plastic.

DE 43 23 827 C1 discloses a method of producing a circuit board. To produce the circuit board two lead frames are arranged in two planes in parallel to each other. At points at which direct electrical connections are to be produced between the lead frames, connection tabs are bent out of the respective conductor so that they are aligned in parallel and in this way can be easily welded to each other. The two lead frames arranged in planes parallel to each other are embedded in plastic through which the circuit board is produced.

US 2008/0102716 also discloses such a method.

SUMMARY

One aim of the present invention is to create a method of producing an assembly with a housing part and at least two conductors.

This task is solved by the subject matter of the independent claims. Preferred forms of embodiment form the subject matter of the dependent claims.

Accordingly the basic concept of the invention is to initially separately produce a first and a second conductor each in the form of a sheet metal part and then with the aid of a suitable injection moulding tool to overmould them at least partially with plastic so that a joint housing part for the conductors is formed. Only after overmoulding is a bonded connection between the two conductors produced, typically by means of welded connection.

Through the idea implemented in the method according to the invention of producing a bonded connection of two conductors only after they have been overmoulded with plastic, it is prevented that the conductors are placed in the moulding tool for the overmoulding process with the mechanical distortion which typically occurs at the bonded connection. This could go far that the conductors to be overmoulded can only be placed in the moulding tool under mechanical stressing. In addition to this, the insertion, in accordance with the inventive method, of the individual conductors which are not yet connected to each other in a bonded manner and have a relatively simple geometric shape as well as relatively limited outer dimensions, is far less complicated and thus simpler than the insertion of an geometric entity made of two more even more conductors that are already connected to each other in a bonded manner thereby making it relatively complex.

On insertion into the moulding tool the individual conductors can exhibit smaller tolerances so that they can be positioned without problems in the moulding tool. After overmoulding with the plastic no mechanical stresses are then present in the produced assembly of a housing part and the at least two conductors which could lead to unwanted deformation of the housing part.

The manufacturing process set out here also allows the first conductor to be used as standard for different applications and to adapt the second conductor to different applications. If, when using the manufacturing method according to the invention various types of electrical actuators for wastegate valves are to be electrically wired, for all types a standard sheet metal part forming the first conductor can be used. In contrast the sheet metal part forming the second conductor can be adapted to the type of electrical wiring - for example with regard to the course of the geometric arrangement or the dimensions of the conductors it can be individually adapted to each electrical actuator. In particular, the first conductor can be specially designed for the integration of specific electrical components, such as, for example, electrical capacitors etc. into the conductor. As one or both end sections of the sheet metal part forming the second conductor typically forms an electrical connection which can be electrically connected to external conductor paths, through suitable design of the second conductor individually adapted connections can be created.

The method according to the invention is thus not only suitable for the production of an assembly with precisely one first conductor and one second conductor, but evolves its advantageous effect precisely then when a plurality of first conductors is to be connected to the same number of second conductors. In this way a plurality of conductors—electrically insulated from one another—can be wired in the joint housing part.

The manufacturing method according to the invention comprises the following four stages a), b), c) and d):

In a first stage a) of the manufacturing process at least one sheet metal component forming the first conductor is provided. In addition, at least one further sheet metal component forming a second conductor is provided. The conductors produced by the sheet metal components can be each punched out of the sheets of metal and in this case typically have the geometry of a metal strip. Through suitable reshaping methods, in particular through bending or bevelling, the sheet metal components can be given a three-dimensional structure.

In the second processing stage b) the at least one first conductor and the at least one second conductor are arranged in an injection moulding tool which can comprise an injection mould. The conductors are arranged in such a way that in order to produce an electrical connection the first conductor is in contact with the second conductor in at least one common contact zone. In this way it can be prevented that during the overmoulding of the conductors with a plastic that is still to be carried out to form a housing part, plastic gets between the contact points of the two sheet metal components or conductors, which would result in unwanted electrical insulation of the conductors with regard to each other.

In a third processing stage c) to form a housing part with the aid of the injection moulding tool the at least one first conductor and the at least one second conductor are at least partially overmoulded with a plastic. Of decisive advantage is that in the common contact zone the plastic cannot penetrate into the intermediate spaces between the conductors. Through overmoulding the conductors with plastic in the injection mould a housing part is formed in which the conductors are held in a mechanically stable manner. The overmoulding of the conductors with plastic can take place in particular in that the first or second conductor passes through the housing part made of plastic. If the housing part is to act as a housing cover or housing base of a two or more part housing, in this way the conductors can be passed through the housing cover or housing base and can be used as electrical connections provided on the outside of the housing part.

In the fourth processing stage d) a permanent electrical connection between the conductors through the bonded connection of the at least one conductor and the at least one second conductor in the area of the common contact zone is produced. Preferably the bonded connection can be produced as a welded or soldered connection.

In a preferred form of embodiment the bonded connection according to step d) is only carried out after cooling of the housing part below a predetermined temperature threshold.

This prevents the housing section that is still hot being exposed to damaging mechanical stresses.

The method according to the invention unfolds its advantageous effect in accordance with a preferred form of embodiment in which in stage a) at least two conductors, preferably a plurality of first conductors and at least two second conductors, preferably a plurality of second conductors are provided in the form of respective sheet metal parts. This means that in stage b) for each first conductor and each second conductor a common contact zone is produced in each case. In this way a plurality of first and second conductors can be fixed to the housing part in the above-described method according to the invention and then electrically connected to each other. This permits the provision of, in principle, any number of conductors so that in each case one first conductor and one second conductor electrically connected thereto form one electrical conductor. The various electrical conductors are electrically insulated from each other. In this way, by using the method according to the invention, a plurality of electrical conductors can be formed on the housing part produced in the injection mould which are all stably fixed to the housing part.

In this form of embodiment several first conductors each with different geometries as well as—alternatively or additionally—second conductors each with different geometries can also be arranged in the injection mould. This allows the production of an assembly with many different conductor geometries.

For creating the bonded connection between the first and second conductor in the area of the common contact zone a person skilled in the art has a variety of options. Particularly preferably the bonded connection is brought about through welding or soldering of the respective conductors in the area of the common contact zone.

In a further preferred form of embodiment the at least one first conductor and the at least one second conductor are arranged in such a way in stage b) that the common contact zone is a common joint zone. This joint zone is formed by a first joint section of the first conductor and a second joint section of the second conductor. After arranging the conductors in the injection mould according to stage b), the two joint sections are aligned with each other in the contact zone. In a joint area of the joint zone complementary to the the common contact zone the joint sections are arranged at a distance from one another wherein this distance has a predetermined maximum value. In other words, the joint zone is an area in which the distance between the two joint sections is at most a predetermined maximum value. In the area of the contact zone which is part of the joint zone, the two joint sections abut each other, preferably in alignment, i.e. the distance between the joint sections has a zero value in the contact zone. The aligned abutment of the two joint sections in the area of the common contact zone and the spaced arrangement of the joint sections in the joint area surrounding the contact zone permits the production of a particularly good bonded connection during stage c) of the method according to the invention.

A particularly good bonded connection can be achieved if the predetermined maximum value for the distance between the joint sections is 1 mm, preferably 0.5 mm, particularly preferably less than 0.1 mm.

In a preferred further development during the course of stage a) or in one or more processing stages following stage a) at least one first projection is provided on the surface of the first joint section. This takes place in that during the course of stage b) the at least one projection for creating the contact zone is brought into contact with the surface of the second joint section facing the first joint section of the first conductor. Such a projection thus forms the common contact zone between the two conductors. Alternatively or additionally to the at least one first projection, on the surface of the second joint section at least one second projection can be provided which then in an analogue manner to the first projection, on arranging the conductors according to step b) for forming the common contact zone can be brought into contact with the surface of the first joint section facing the second joint section of the second conductor. In this way the effective contact area between the two joint sections can be kept small so that the electrical current flowing between the joint sections during the course of the welding process for producing a bonded connection only flows through a small contact zone. The material melting for the bonded connection therefore initially takes place in the very small contact zone and only then in the joint area of the joining zone surrounding contact zone. In this way an improved welding seam is formed.

A particularly good bonded connection can be produced in an advantageous further development of the aforementioned form of embodiment if a plurality of first and/or second projections is provided, wherein in a view from above the projections are arranged on the first surface of the first joint section facing the second joint section or on the second surface of the second joint section facing the first joint section in a lattice or grid-like manner.

In an advantageous further development of the invention the first and/or second projection can be designed in such a way that they completely encompass at least one joint area. In this way it can be prevented that during the course of stage c) when injecting plastic into the injection mould the plastic penetrates into the joint area and in certain circumstances can reduce the electrical contact between the conductors to be electrically connected to each other.

It is taken as understood that the features set out above and still to be explained below can not only be used in the combination indicated in each case but also in other combinations or by themselves without departing from the framework of the present invention.

Preferred examples of embodiment of the invention are set out in the drawings and are explained in more detail in the following description, wherein the same reference numbers relate to identical or similar or functionally the same components.

BRIEF DESCRIPTION OF THE DRAWINGS

Schematically in each case

DETAILED DESCRIPTION

Figure 1:
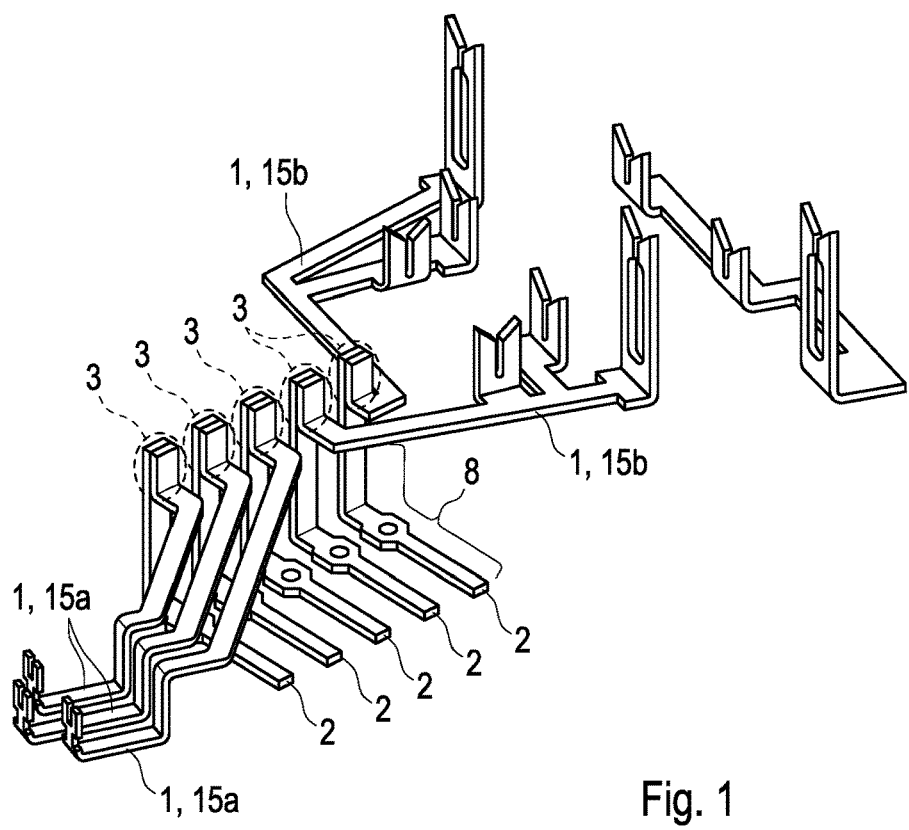
FIG. 1 shows a plurality of first and second conductors before overmoulding with plastic.

FIG. 1 shows a plurality of first conductors 1 and a plurality of second conductors 2 which are provided in the form of sheet metal parts in a first processing stage a). For this sheet metal parts can be punched out of one or more strips of sheet metal. By way of a reshaping process following the punching out, typically through bending and/or bevelling, the sheet metal parts can be reshaped in such a way that they extend in all three directions of three-dimensional space as shown in FIG. 1.

In the example of FIG. 1 the first conductors also labelled with reference number 15a have a different geometry from the first conductors 1 also labelled with reference number 15b. The method according to the invention presented here therefore allows the manufacturing of an assembly with different conductor geometries. It is taken as understood the second conductors 2 can also be selected with different geometries (not shown in FIG. 1). In this way many different variation options are opened up for a person skilled in the art.

Figure 2:
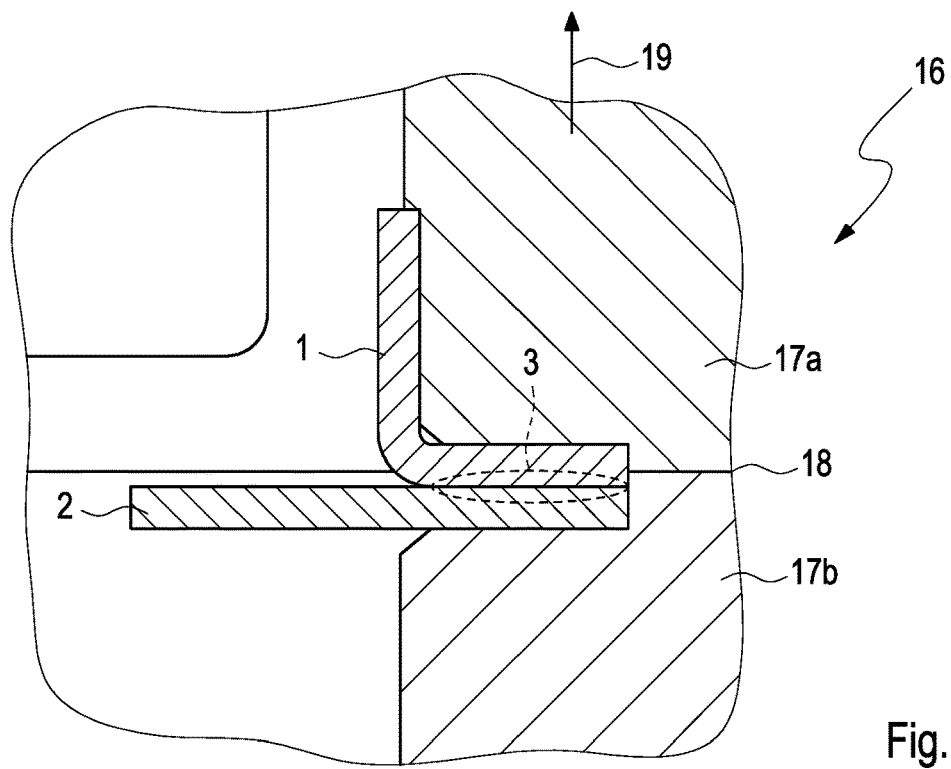
FIG. 2 shows a rough diagram of a first and a second conductor after arrangement in a moulding tool.

From the illustration in FIG. 2 it can be seen that during the course of processing stage b) the first conductors 1 and the second conductors 2 are arranged in an injection mould of an injection tool 16 in such a way that in a common contact zone 3 each first conductor 1 mechanically contacts a second conductor 2 assigned to it in order to produce an electrical connection between the conductors 1, 2 (in FIG. 2 for the sake of clarity only one first conductor 1 and one second conductor 2 are shown). As can be seen from FIG. 2, the injection mould or moulding tool 16 can have a first and a second mould part 17a, 17b. The arrow marked 19 shows the direction of opening of the injection tool 16. The contact zone 3 is preferably located in the area of the mould separation 18 between the two mould sections 17a, 17b.

Figure 4:
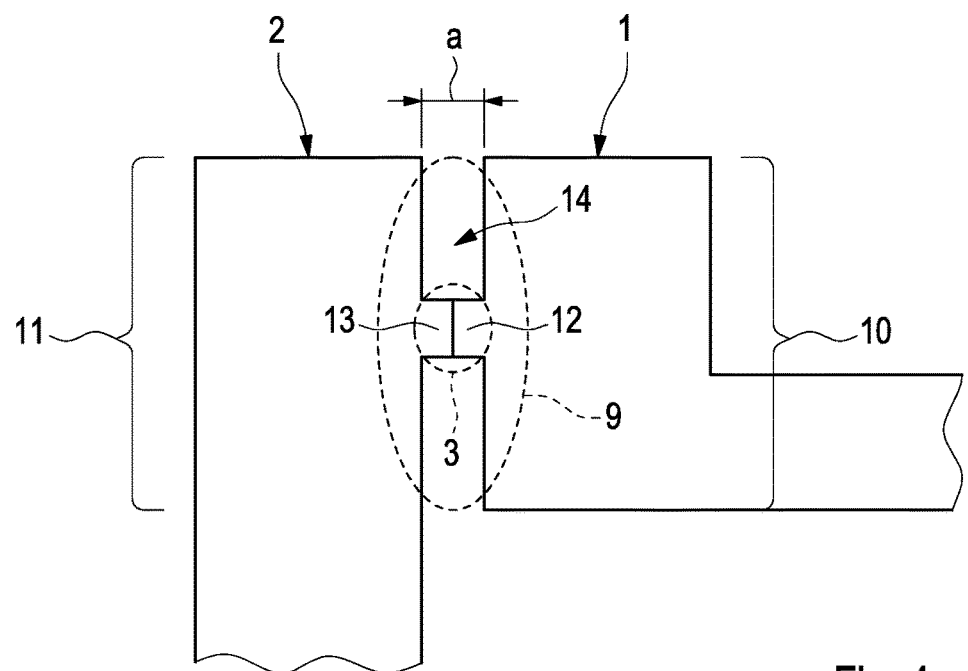
FIG. 4 shows a detailed view of the conductors of FIG. 1 in the area of a common contact zone.

In FIG. 4 the common contact zone 3 between the first conductor 1 and the second conductor 2 is shown enlarged and in a view from the side. As can be seen from FIG. 4, the first conductor 1 and the second conductor 2 are arranged in such a way with regard to each other that the common contact zone 3 is part of a common joint zone 9 which is formed by a first joint section 10 of the first conductor 1 and by a second joint section 11 of the second conductor 2. In the area of the joint zone 9 the two joint sections 10, 11 are arranged at a distance from one another wherein this distance is at most a predetermined maximum value a. In the contact zone 3 which is part of the joint zone 9, this distance assumes a zero value, i.e. the two joint sections 10, 11 are in aligned contact with each other in the joint section 10, 11. In the joint area 14 complementary to the contact zone 3 the two joint sections 10, 11 are arranged at a distance from one another wherein this distance is at most a predetermined maximum value a. For example the predetermined maximum value a defining the joint zone 9 can be 1 mm for the joints sections 10, 11. Preferably the maximum value is 0.5 mm, particularly preferably 0.1 mm.

As shown in FIG. 4, in order to create the common contact zone 3 in which the two joint section 10, 11 abut each other, i.e. before the bonded connection accordance with stage d) they are mechanically in contact with each other, a first projection 12 can be provided on the surface of the first joint section 10 facing the second joint section 11 of the second conductor 2. This can take place in particular during the course of reshaping of the sheet metal parts. Alternatively or additionally a second projection 13 can be provided on the surface of the second joint section 11 facing the first joint section 10 of the first conductor 1. FIG. 4 shows a special case in which both projections 12, 13 of the first and second conductor 1, 2 respectively abut each other to form the contact zone 3.

Figure 5:
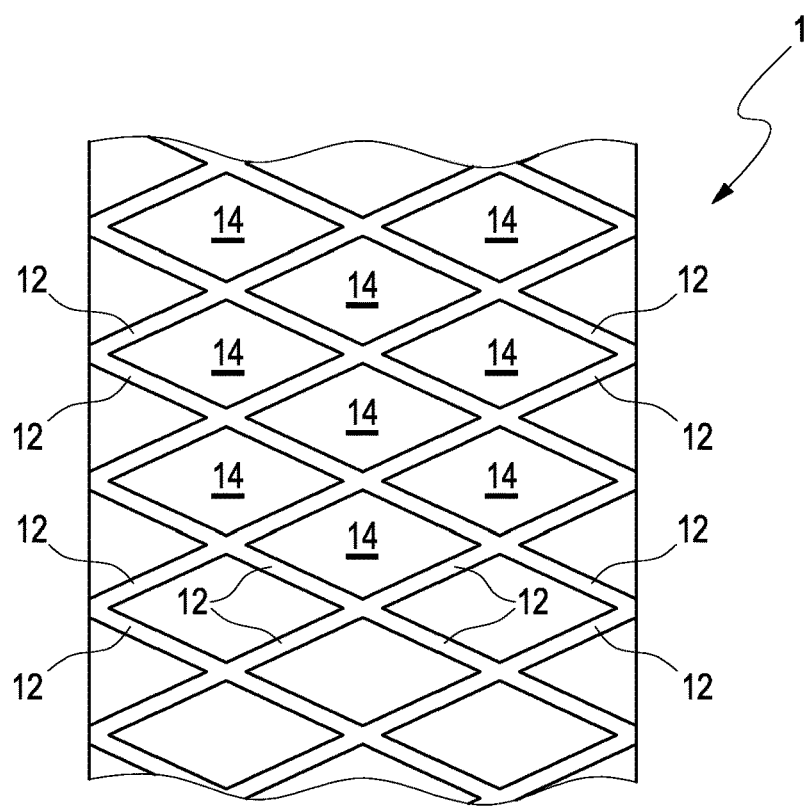
FIG. 5 shows a view from above of a surface of the first conductor forming the contact zone.

Particularly preferably a plurality of first and/or second projections 12, 13 can be provided, wherein in a view from above the projections 12, 13 are arranged on the first surface of the first joint section 10 or on the second surface of the second joint section 11 in a lattice or grid-like manner. This is illustrated as an example in FIG. 5 which shows a view from above of the surface of the first conductor facing the second conductor 2. It can be seen that a plurality of first projections 12 is provided which have a lattice-like structure. As can be seen in FIG. 5 the structure of the lattice can have a diamond-shaped geometry, Several joint areas 14 are completely encompassed through the projections 12. In this way it can be prevented that during injection plastic can enter the fully encompassed joint areas 14 and reduce the electrical connection between the two conductors 1, 2. In variants of the example a grid-like arrangement of the projections 12 is conceivable (not shown). Compared with a lattice-like structure the contact area between the two conductors 1, 2 can be reduced again in this way, On the surface of the second conductor 2 facing the first conductor 1 the projections 12 can also form a lattice-like structure as explained in FIG. 5 by way of the first conductor. The above explanations relating to the first conductor 1 can therefore use mutatis mutandis.

Figure 3:
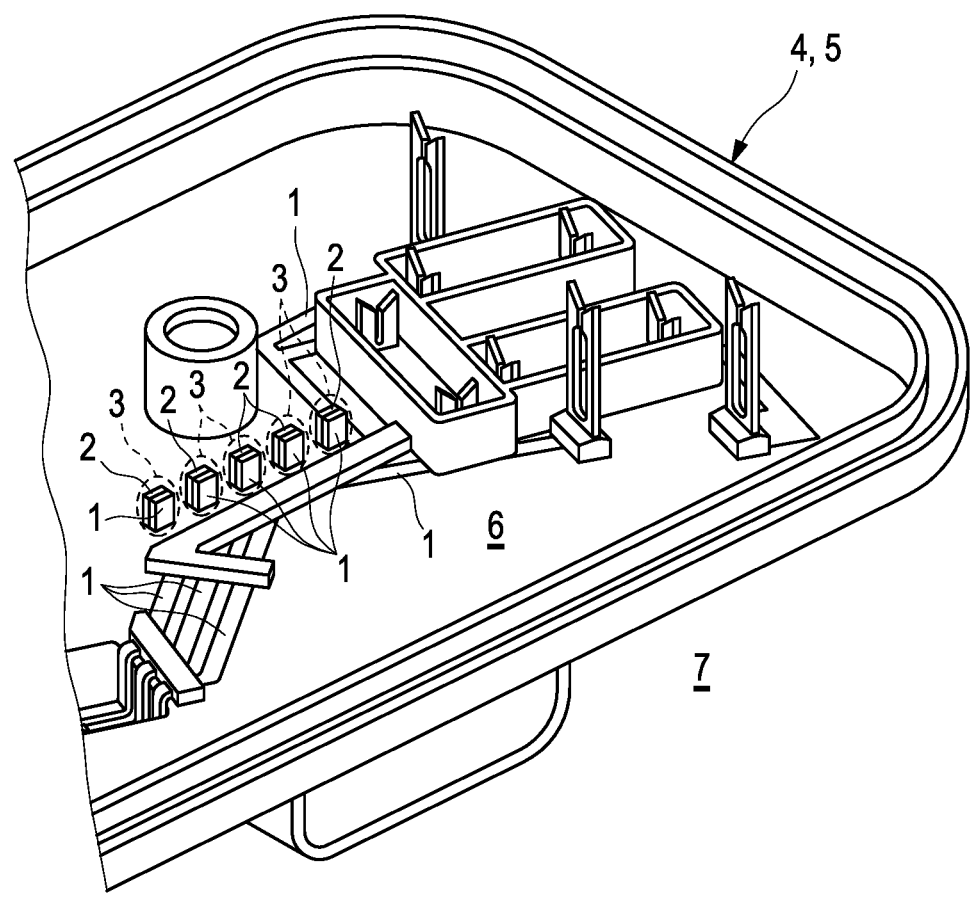
FIG. 3 shows the first and second conductors according to FIG. 1 after overmoulding with plastic.

In a third processing stage c) the first conductors 1 and the second conductors 2 are at least partially overmoulded with a plastic to form a housing part 4. In this way the conductors 1, 2 are fixed to the housing part 4 so that the latter can act as a carrier component for the conductors 1, 2. Such a housing part 4 is shown in FIG. 3. The housing part 4 can be part of a multiple part housing (not shown) in which the the conductors 1, 2 are to be incorporated.

In the example in FIG. 3 the housing part 4 is a housing cover 5 which together with a housing base (not shown) defines an interior space 6 of the housing. From FIG. 3 it can be seen that overmoulding can take place in that the second conductor 2 is passed through the housing part 4. In the example in FIG. 3 the end sections (covered by the housing part 4 in FIG. 3, labelled 8 in FIG. 1) passed from the interior space 6 of the housing through the housing part 4 out into the surrounding area 7 form electrical connections which are arranged outside, i.e. on the side of the housing part 4 facing the surrounding area 7.

In a fourth processing stage d) each of the first conductors 1 is connected in a bonded manner, preferably by means of a welded connection, to the second conductor 2 assigned thereto in the region of the contact zone 3. In this way a permanent electrical connection is produced between the first conductors 1 and the respective second conductor 2. Preferably the bonding according to step d) is carried out after cooling of the housing part (4) below a predetermined temperature threshold.

In the example in FIG. 4 the effective contact area through which electrical current flows during the welding procedure is restricted to the projections 12, 13. In this way material melting for the bonded connection between the conductors 1, 2 initially takes place in the very small contact zone and only thereafter in the joint area of the joining zone surrounding contact zone. In this way an improved welding seam is formed.

The invention claimed is:

1. A method of manufacturing an assembly with at least two conductors of shape sheet metal parts, comprising:
   providing at least one first conductor formed from at least one sheet metal part and at least one second conductor formed from at least one sheet metal part;
   arranging the at least one first conductor and the at least one second conductor in an injection mould in such a way that the at least one first conductor comes into mechanical contact with the at least one second conductor in a common contact zone to produce an electrical connection;
   at least partially overmoulding the at least one first conductor and the at least one second conductor with a plastic to form a joint housing part for the at least one first conductor and the at least one second conductor; and
   bonding the at least one first conductor and the at least one second conductor in a region of the common contact zone after the at least partially overmoulding the at least one first conductor and the at least one second conductor with the plastic;
   wherein the at least one first conductor is provided with a first joint section and the at least one second conductor is provided with a second joint section, and wherein at least one of:
      at least one first projection on a surface of the first joint section abuts a surface of the second joint section facing the first joint section in the common contact zone when arranged in the injection mould; and
      at least one second projection on a surface of the second joint section abuts a surface of the first joint section facing the second joint section in the common contact zone when arranged in the injection mould.

2. The method according to claim 1, further comprising:
   cooling the joint housing part below a predetermined temperature threshold before bonding the at least one first conductor and the at least one second conductor.

3. The method according to claim 1, wherein:
   the at least one first conductor includes at least two first conductors and the at least one second conductor includes at least two second conductors;
   each first conductor comes into mechanical contact with one second conductor in one common contact zone; and
   at least one of:
      the at least two first conductors have a different geometry with regard to each other; and
      the at least two second conductors have a different geometry with regard to each other.

4. The method according to claim 1, wherein the bonding includes welding or soldering of the at least one first conductor to the at least one second conductor in the region of the common contact zone.

5. The method according to claim 1, wherein at least one of the at least one first projection and the at least one second projection has a grid-like structure in a view from above the corresponding surface of the first joint section or the second joint section.

6. The method according to claim 1, wherein at least one of the at least one first projection and the at least one second projection completely encompass one joint area.

7. The method according to claim 1, wherein:
   a common joint zone is defined between the first joint section and the second joint section when the at least one first conductor and the at least one second conductor are arranged in the injection mold, the common joint zone encompassing the common contact zone; and
   the bonding includes welding the at least one first conductor to the at least one second conductor in the region of the common contact zone prior to welding in an area of the common joint zone outside of the common contact zone.

8. The method according to claim 1, wherein:
   the first joint section includes the at least one first projection, the at least one first projection protruding from the first joint section toward the at least one second conductor;
   the second joint section includes the at least one second projection, the at least one second projection protruding from the second joint section toward the at least one first conductor; and
   the arranging the at least one first conductor and the at least one second conductor in the injection mould includes bringing the at least one first projection and the at least one second projection into mechanical contact with one another to define the common contact zone.

9. A method comprising:
  providing at least two first conductors each formed from a sheet metal part and having different geometries from each other, and at least two second conductors each formed from a sheet metal part and having different geometries from each other;
  arranging the at least two first conductors and the at least two second conductors in an injection mould in such a way that each first conductor comes into mechanical contact with a corresponding second conductor in a common contact zone to produce an electrical connection;
  at least partially overmoulding the at least two first conductors and the at least two second conductors with a plastic to form a joint housing part for the at least two first conductors and the at least two second conductors;
  bonding each first conductor with the corresponding second conductor in a region of the respective common contact zone after the at least partially overmoulding the at least one first conductor and the at least one second conductor with the plastic; and
  cooling the joint housing part below a predetermined temperature threshold before the bonding each first conductor with the corresponding second conductor; and
  wherein each first conductor and the corresponding second conductor define a conductor pair of a plurality of conductor pairs, and the at least two first conductors and the at least two second conductors are arranged in the injection mould such that the plurality of conductor pairs are electrically insulated from one other when the at least two first conductors and the at least two second conductors are at least partially overmoulded with the plastic.

10. The method according to claim 9, wherein at least one of:
  each first conductor is provided with a first joint section and each second conductor is provided with a second joint section such that at least one first projection on a surface of the first joint section abuts a surface of the second joint section facing the first joint section in the common contact zone when arranged in the injection mould; and
  at least one second projection on the surface of the second joint section abuts a surface of the first joint section facing the second joint section in the common contact zone when arranged in the injection mould.

11. The method according to claim 10, wherein at least one of the at least one first projection and the at least one second projection has a grid-like structure in a view from above the corresponding surface of the first joint section or the second joint section.

12. The method according to claim 10, wherein at least one of the at least one first projection and the at least one second projection completely encompass one joint area.

13. The method according to claim 9, wherein the arranging of the at least two first conductors and the at least two second conductors in the injection mould includes arranging the at least two first conductors and the at least two second conductors such that the common contact zone is positioned in an area of a mould separation defined between two mould parts of the injection mould.

14. A method of manufacturing an assembly with at least two conductors of shape sheet metal parts, comprising:
  providing at least one first conductor formed from at least one sheet metal part and at least one second conductor formed from at least one sheet metal part;
  arranging the at least one first conductor and the at least one second conductor in an injection mould in such a way that the at least one first conductor comes into mechanical contact with the at least one second conductor in a common contact zone to produce an electrical connection;
  at least partially overmoulding the at least one first conductor and the at least one second conductor with a plastic to form a joint housing part for the at least one first conductor and the at least one second conductor; and
  bonding the at least one first conductor and the at least one second conductor in a region of the common contact zone after the at least partially overmoulding the at least one first conductor and the at least one second conductor with the plastic;
  wherein the arranging of the at least one first conductor and the at least one second conductor in the injection mould includes arranging the at least one first conductor and the at least one second conductor such that the common contact zone is positioned in an area of a mould separation defined between two mould parts of the injection mould.

* * * * *